(12) United States Patent
Matsumoto et al.

(10) Patent No.: US 10,409,338 B2
(45) Date of Patent: Sep. 10, 2019

(54) SEMICONDUCTOR DEVICE PACKAGE HAVING AN OSCILLATOR AND AN APPARATUS HAVING THE SAME

(71) Applicant: Toshiba Memory Corporation, Tokyo (JP)

(72) Inventors: Manabu Matsumoto, Yokahama Kanagawa (JP); Katsuya Murakami, Sumida Tokyo (JP); Akira Tanimoto, Yokohama Kanagawa (JP); Isao Ozawa, Chigasaki Kanagawa (JP); Yuji Karakane, Nagoya Aichi (JP); Tadashi Shimazaki, Yokohama Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 585 days.

(21) Appl. No.: 15/057,507

(22) Filed: Mar. 1, 2016

(65) Prior Publication Data
US 2017/0010639 A1 Jan. 12, 2017

(30) Foreign Application Priority Data
Jul. 9, 2015 (JP) .................................. 2015-138083

(51) Int. Cl.
*G11C 7/04* (2006.01)
*G06F 1/18* (2006.01)
(Continued)

(52) U.S. Cl.
CPC ................ *G06F 1/183* (2013.01); *G11C 7/04* (2013.01); *G11C 16/06* (2013.01); *G11C 16/10* (2013.01);
(Continued)

(58) Field of Classification Search
USPC .......................................... 361/783, 717, 764
See application file for complete search history.

(56) References Cited

U.S. PATENT DOCUMENTS

| 7,352,206 B1 * | 4/2008 | Zhu ........................ G01K 7/015 326/38 |
| 7,894,035 B2 | 2/2011 | Kim |

(Continued)

FOREIGN PATENT DOCUMENTS

| JP | 2005222228 A | 8/2005 |
| JP | 2007165928 A | 6/2007 |

(Continued)

OTHER PUBLICATIONS

Japanese Office Action dated Mar. 22, 2018, filed in Japanese counterpart Application No. 2015-138083, 16 pages (with translation).

(Continued)

*Primary Examiner* — Andargie M Aychillhum
(74) *Attorney, Agent, or Firm* — Kim & Stewart LLP

(57) ABSTRACT

A semiconductor device package includes a substrate including, on an edge thereof, a connector that is connectable to a host, a nonvolatile semiconductor memory device disposed on a surface of the substrate, a memory controller disposed on the surface of the substrate, an oscillator disposed on the surface of the substrate and electrically connected to the memory controller, and a seal member sealing the nonvolatile semiconductor memory device, the memory controller, and the oscillator on the surface of the substrate.

17 Claims, 13 Drawing Sheets

(51) Int. Cl.

| | | |
|---|---|---|
| *H01L 25/065* | (2006.01) | |
| *H01L 25/18* | (2006.01) | |
| *H01L 25/00* | (2006.01) | |
| *G11C 16/10* | (2006.01) | |
| *G11C 16/14* | (2006.01) | |
| *G11C 16/26* | (2006.01) | |
| *G11C 16/30* | (2006.01) | |
| *G11C 29/12* | (2006.01) | |
| *G11C 16/06* | (2006.01) | |
| *G11C 29/48* | (2006.01) | |
| *H01L 23/31* | (2006.01) | |
| *H01L 23/34* | (2006.01) | |
| *H01L 23/00* | (2006.01) | |
| *H01L 21/56* | (2006.01) | |
| *G11C 29/04* | (2006.01) | |
| *G11C 29/56* | (2006.01) | |

(52) U.S. Cl.
CPC .............. *G11C 16/14* (2013.01); *G11C 16/26* (2013.01); *G11C 16/30* (2013.01); *G11C 29/12* (2013.01); *G11C 29/1201* (2013.01); *G11C 29/48* (2013.01); *H01L 25/0652* (2013.01); *H01L 25/18* (2013.01); *H01L 25/50* (2013.01); *G11C 2029/0401* (2013.01); *G11C 2029/5602* (2013.01); *H01L 21/565* (2013.01); *H01L 23/3121* (2013.01); *H01L 23/34* (2013.01); *H01L 24/32* (2013.01); *H01L 24/48* (2013.01); *H01L 24/49* (2013.01); *H01L 24/73* (2013.01); *H01L 2224/04042* (2013.01); *H01L 2224/06135* (2013.01); *H01L 2224/32145* (2013.01); *H01L 2224/32225* (2013.01); *H01L 2224/48091* (2013.01); *H01L 2224/48227* (2013.01); *H01L 2224/48235* (2013.01); *H01L 2224/49171* (2013.01); *H01L 2224/49175* (2013.01); *H01L 2224/73265* (2013.01); *H01L 2225/0651* (2013.01); *H01L 2225/06548* (2013.01); *H01L 2225/06562* (2013.01); *H01L 2225/06589* (2013.01); *H01L 2225/06596* (2013.01); *H01L 2924/141* (2013.01); *H01L 2924/1425* (2013.01); *H01L 2924/1432* (2013.01); *H01L 2924/1436* (2013.01); *H01L 2924/1438* (2013.01); *H01L 2924/1443* (2013.01); *H01L 2924/15192* (2013.01); *H01L 2924/15311* (2013.01); *H01L 2924/15313* (2013.01); *H01L 2924/3011* (2013.01)

(56) References Cited

U.S. PATENT DOCUMENTS

| | | | |
|---|---|---|---|
| 8,547,703 | B2 | 10/2013 | Aoki et al. |
| 8,648,453 | B2 * | 2/2014 | Shinohara ............ H01L 21/561 257/678 |
| 9,275,947 | B2 | 3/2016 | Ozawa et al. |
| 2006/0184709 | A1 * | 8/2006 | Sukegawa ............ G06K 19/077 710/313 |
| 2007/0176705 | A1 * | 8/2007 | Sutardja .................. H01L 23/34 331/176 |
| 2014/0173140 | A1 * | 6/2014 | Bates .................... G06F 13/382 710/16 |
| 2015/0035711 | A1 | 2/2015 | Ito |
| 2015/0130059 | A1 | 5/2015 | Ozawa et al. |
| 2015/0200008 | A1 | 7/2015 | Ozawa et al. |

FOREIGN PATENT DOCUMENTS

| | | |
|---|---|---|
| JP | 2007323050 A | 12/2007 |
| JP | 2010147090 A | 7/2010 |
| JP | 2010258304 A | 11/2010 |
| JP | 2011061126 A | 3/2011 |
| JP | 2011095961 A | 5/2011 |
| JP | 2013182291 A | 9/2013 |
| JP | 2014179484 A | 9/2014 |
| JP | 2015032900 A | 2/2015 |
| JP | 2015099890 A | 5/2015 |
| JP | 2015103782 A | 6/2015 |
| JP | 2015103950 A | 6/2015 |

OTHER PUBLICATIONS

Notification of Reasons for Refusal dated Oct. 5, 2018 in corresponding Japanese Patent Application No. 2015-138083 with English translation, 8 pages.

\* cited by examiner

SEMICONDUCTOR DEVICE PACKAGE HAVING AN OSCILLATOR AND AN APPARATUS HAVING THE SAME

CROSS-REFERENCE TO RELATED APPLICATION

This application is based upon and claims the benefit of priority from Japanese Patent Application No. 2015-138083, filed Jul. 9, 2015, the entire contents of which are incorporated herein by reference.

FIELD

Embodiments described herein relate generally to a semiconductor device package, in particular, a semiconductor device package having an oscillator.

BACKGROUND

A semiconductor device of one type has a controller and a non-volatile memory that are integrated in the same package and sealed.

DETAILED DESCRIPTION

Figure 1:
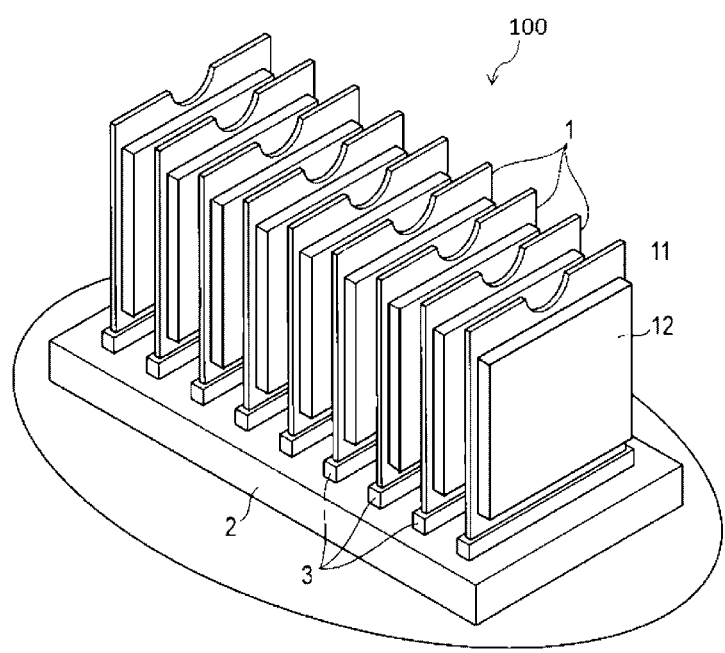
FIG. 1 is a perspective view of a system including a plurality of semiconductor devices according to a first embodiment.

One or more embodiments are directed to providing a reliable semiconductor device.

In general, according to an embodiment, a semiconductor device package includes a substrate including, on an edge thereof, a connector that is connectable to a host, a non-volatile semiconductor memory device disposed on a surface of the substrate, a memory controller disposed on the surface of the substrate, an oscillator disposed on the surface of the substrate and electrically connected to the memory controller, and a seal member sealing the nonvolatile semiconductor memory device, the memory controller, and the oscillator on the surface of the substrate.

Hereinafter, embodiments will be described with reference to the drawings.

Some elements are described with multiple expressions in the present specification. These expressions are examples, and those elements may be described with other expressions. Elements that are not described with multiple expressions may be described with other expressions.

The drawings are for schematic purposes and may have a relationship between thickness and a planar dimension, the ratio of thickness between each layer, and the like different from actual relationship. In addition, a part having a different dimensional relationship or ratio may be included between the drawings. Furthermore, some of components or configurations may not be illustrated in the drawings for convenience of description.

First Embodiment

Figure 2:
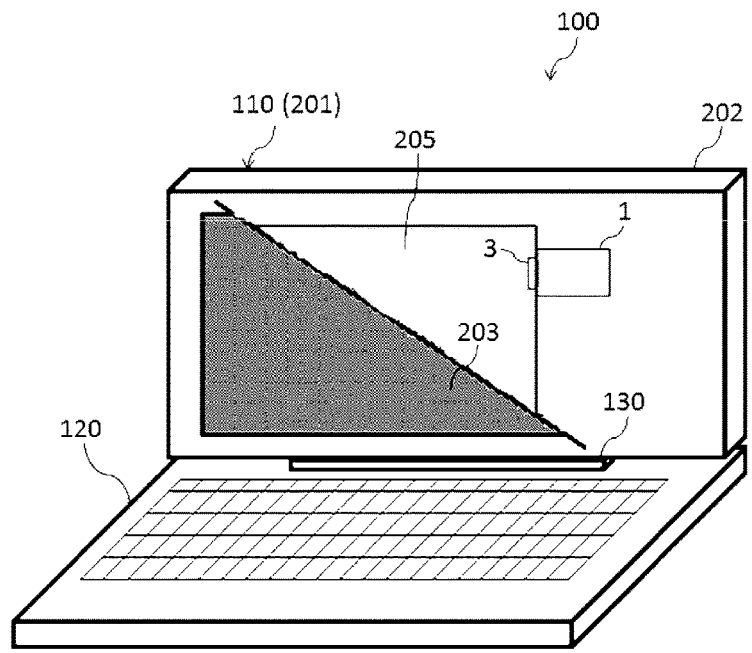
FIG. 2 is a perspective view of another system including the semiconductor device according to the first embodiment.
Figure 3:
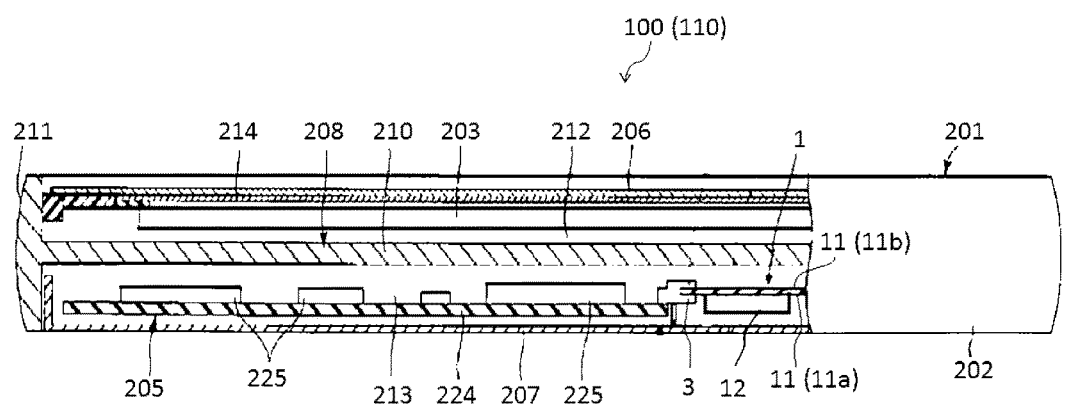
FIG. 3 is a cross-sectional view of a tablet portion of the system shown in FIG. 2.

FIG. 1 to FIG. 3 illustrate a system 100 including a plurality of semiconductor devices 1 according to a first embodiment. The system 100 is an example of "electronic apparatus". The semiconductor device 1 is an example of "semiconductor module" and "semiconductor memory device". The semiconductor device 1 according to the present embodiment is a memory system such as a solid state drive (SSD) but is not limited thereto.

The semiconductor device 1 according to the present embodiment is, for example, a comparatively small module, and an example of the external dimension thereof is 22 mm×30 mm, which is called M.2-2230. The size of the semiconductor device 1 is not limited thereto. The configuration of the semiconductor device 1 according to the present embodiment is applicable to semiconductor devices of various sizes.

As illustrated in FIG. 1, each of the semiconductor devices 1 is included, as a memory device, in the system 100, which is, for example, a server. The system 100 includes the plurality of semiconductor devices 1 and a host apparatus (mother board) 2 on which the semiconductor devices 1 are mounted. The host apparatus 2 includes, for example, multiple connectors 3 (for example, slots) that are open upward. The plurality of semiconductor devices 1 is respectively mounted on the connectors 3 of the host apparatus 2 and arranged in a substantially standing position. According to such a configuration, the plurality of semiconductor devices 1 can be mounted in a compact and collective manner, and the size of the host apparatus 2 can be reduced.

The semiconductor device 1 may be employed as a storage device of an electronic apparatus such as a notebook portable computer, a tablet terminal, or a detachable notebook personal computer (PC). In FIG. 2 and FIG. 3, a single semiconductor device 1 is mounted on a detachable notebook PC, which corresponds to the host apparatus 2. Since the detachable notebook PC is an example of the host apparatus 2, the detachable notebook PC will be described with the same reference sign and will be described as a detachable notebook PC 2. In addition, the entire detachable notebook PC 2 to which the semiconductor device 1 is connected will be regarded as the system 100.

FIG. 2 illustrates the semiconductor device 1 mounted on the detachable notebook PC 2. FIG. 3 is a cross-sectional view of a display unit 110 (tablet portable computer 201) of the detachable notebook PC 2 illustrated in FIG. 2. In the detachable notebook PC 2, the display unit 110 and a keyboard unit 120 (first input receiving device) are connected by a connection unit 130 so as to be separable from each other.

The semiconductor device 1 is mounted on the display unit 110 side of the detachable notebook PC 2 as illustrated in FIG. 2 and FIG. 3. Therefore, the display unit 110, if being detached, can function as the tablet portable computer 201 (second input receiving device) as well.

The portable computer 201 is an example of an electronic apparatus and, for example, has a size that allows a user to hold and employ the portable computer 201 with a hand.

The portable computer 201 includes a casing 202, a display module 203, the semiconductor device 1, and a motherboard 205 as main elements. The casing 202 includes a protective plate 206, a base 207, and a frame 208. The protective plate 206 is a quadrangular plate made of glass or plastic and configures the surface of the casing 202. The base 207 is made of metal such as aluminum alloy or magnesium alloy and configures the bottom of the casing 202.

The frame 208 is arranged between the protective plate 206 and the base 207. The frame 208 is made of metal such as aluminum alloy or magnesium alloy and includes a mount unit 210 and a bumper unit 211 integrally. The mount unit 210 is arranged between the protective plate 206 and the base 207. According to the present embodiment, the mount unit 210 defines a first mount space 212 with the protective plate 206 and defines a second mount space 213 with the base 207.

The bumper unit 211 is integrally formed with the outer peripheral portion of the mount unit 210 to surround the first mount space 212 and the second mount space 213 continuously in the peripheral direction thereof. Furthermore, the bumper unit 211 extends in a thickness direction of the casing 202 over the outer peripheral portion of the protective plate 206 as well as the outer peripheral portion of the base 207, configuring an outer peripheral surface of the casing 202.

The display module 203 is accommodated in the first mount space 212 of the casing 202. The display module 203 is covered by the protective plate 206 while a touch panel 214 having a handwriting input function is disposed between the protective plate 206 and the display module 203. The touch panel 214 is bonded to the rear surface of the protective plate 206.

The semiconductor device 1 is accommodated in the second mount space 213 of the casing 202 together with the motherboard 205 as illustrated in FIG. 3. The semiconductor device (semiconductor device package) 1 includes a substrate 11 and a semiconductor (sealing) package 12.

The substrate 11 includes a mount surface 11a where multiple conductor patterns are formed. The semiconductor package 12 is mounted on the mount surface 11a of the substrate 11 and soldered to the conductor patterns (not illustrated).

The motherboard 205 includes a substrate 224 and multiple circuit components 225 such as a semiconductor package and a chip. Multiple conductor patterns (not illustrated) are formed in the substrate 224. The circuit components 225 are mounted on the substrate 224 and electrically connected thereto as being soldered to the conductor patterns of the substrate 224.

The semiconductor device 1 according to the present embodiment is single-side mounted as illustrated in FIG. 3, and the mount surface 11a of the substrate 11 faces the opposite side of the semiconductor device 1 (i.e., apart from the display module 203). In other words, a surface 11b of the semiconductor device according to the present embodiment on which a component protruding from the surface of the substrate 11, such as the semiconductor package 12, is not mounted faces the display module 203 side of the semiconductor device 1. By arranging the substrate 11 to be disposed between the semiconductor package 12 and the display module 203, thermal interference can be reduced between the display module 203 and the semiconductor package 12. Hereinafter, a detailed configuration of the semiconductor device 1 according to the present embodiment will be described with reference to the drawings.

Figure 4:
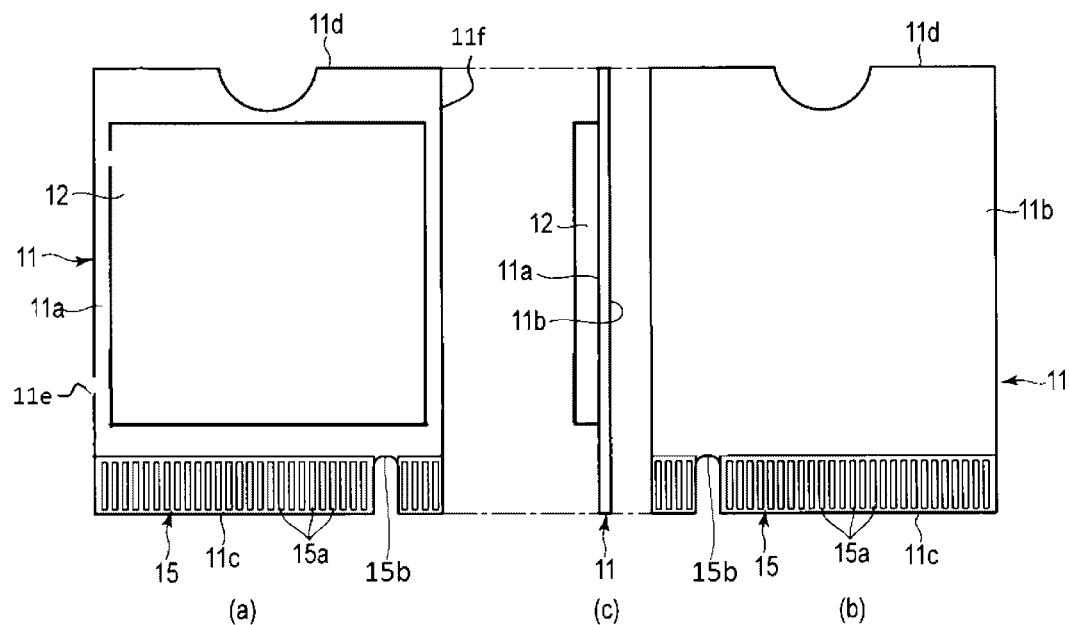
FIG. 4 illustrates the semiconductor device according to the first embodiment, where (a) is a front view, (b) is a rear view, and (c) is a side view.

FIG. 4 illustrates the exterior of the semiconductor device 1. (a) of FIG. 4 is a plan view, (b) of FIG. 4 is a bottom view, and (c) of FIG. 4 is a side view thereof. As illustrated in FIG. 4, the semiconductor device 1 includes the substrate 11 and the semiconductor package 12.

The substrate 11 is a substantially rectangular printed substrate configured of a material such as glass epoxy resin and defines the external dimension of the semiconductor device 1. The substrate 11 includes the first surface 11a and the second surface 11b, which are opposite to each other. The first surface 11a is a component mount surface on which the semiconductor package 12 is mounted.

The semiconductor device 1 according to the present embodiment has a configuration in which multiple components arranged independently of the substrate 11 are mainly mounted on a single side (11a) of the substrate 11 during manufacturing of the semiconductor device 1 as described above. The multiple components mounted on the first surface 11a are collectively sealed by a resin material and become an integrated mount component seen as the semiconductor package 12. In the present embodiment, the word "integrated" means the state of a thing that is bonded so as not to be detached, and the term "integrated mount component" is regarded as one module unit during manufacturing of the semiconductor device 1.

Meanwhile, the second surface 11b is a non-component mount surface on which no components are mounted. By arranging multiple components arranged independently of the substrate 11 to be concentrated on one surface of the substrate 11, protrusion of components from the substrate 11 can be formed only on a single side of the substrate 11. Accordingly, the semiconductor device 1 can be thin in comparison with the case where components protrude from both of the first surface 11a and the second surface 11b of the substrate 11.

The substrate 11 includes a first edge portion 11c and a second edge portion 11d, which is positioned on a side opposite to the first edge portion 11c as illustrated in FIG. 4. The first edge portion 11c includes an interface unit 15 (connector, substrate interface unit, terminal unit, and connection unit). The interface unit 15, for example, includes multiple connection terminals 15a (metal terminals). The interface unit 15 is configured to be inserted into the connector 3 of the host apparatus 2 and electrically connected to the connector 3. The interface unit 15 exchanges signals (control signal and data signal) with the host apparatus 2.

The interface unit 15 according to the present embodiment is an interface that complies with, for example, the PCI Express (hereinafter, PCIe) standard. That is, a high-speed signal (high-speed differential signal) complying with the PCIe standard flows between the interface unit 15 and the host apparatus 2. The interface unit 15 may comply with other standards such as Serial Advanced Technology Attachment (SATA), Universal Serial Bus (USB), and Serial Attached SCSI (SAS). The semiconductor device 1 receives supply of power from the host apparatus 2 through the interface unit 15.

A slit 15b is formed at a position shifted from the center along the transverse direction of the substrate 11 in the interface unit 15 and is configured to fit to a protrusion (not illustrated) or the like arranged on the connector 3 side of the host apparatus 2. Accordingly, it is possible to prevent the semiconductor device 1 from being inserted with the front and rear thereof.

Next, the semiconductor package 12 mounted on the substrate 11 will be described in detail with reference to the drawings. The semiconductor package 12 according to the present embodiment is a system in package (SiP) module where multiple semiconductor chips are sealed in one package.

Figure 5:
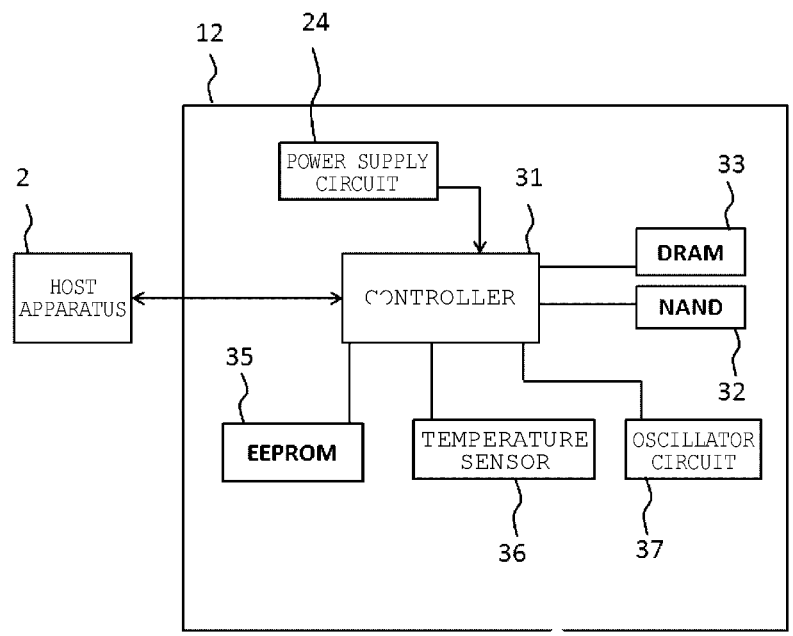
FIG. 5 is a block diagram of a semiconductor package that comprises the semiconductor device according to the first embodiment.

FIG. 5 illustrates an example of a system configuration of the semiconductor package 12. The semiconductor package 12 includes a power supply component (circuit) 24, a controller (module) 31, multiple semiconductor memories 32, a dynamic random access memory (DRAM) 33, an electrically erasable programmable ROM (EEPROM) 35, a temperature sensor 36, an oscillator circuit (module) 37, and electronic components such as a resistor and a capacitor not illustrated in FIG. 5.

The power supply component 24 is, for example, a DC-DC converter and generates a predetermined voltage necessary for the semiconductor package 12 and the like using the power supplied from the host apparatus 2.

The controller 31 controls operations of the multiple semiconductor memories 32. That is, the controller 31 controls writing, reading, and erasing of data with respect to the multiple semiconductor memories 32.

Each of the multiple semiconductor memories 32 is, for example, a NAND memory (NAND flash memory). The NAND memory is an example of non-volatile memory.

The DRAM 33 is an example of volatile memory and employed in caching data or storing management information of the semiconductor memories 32.

The EEPROM 35 stores a control program and the like as fixed information. The temperature sensor 36 detects the temperature inside the semiconductor package 12 and notifies the temperature to the controller 31. The oscillator circuit 37 supplies an operation signal of a predetermined frequency to the controller 31. More specifically, the oscillator circuit 37 generates periodic signal (AC signal), and, in general, the operation signal of a predetermined frequency depends on specification of the controller 31.

Figure 6:
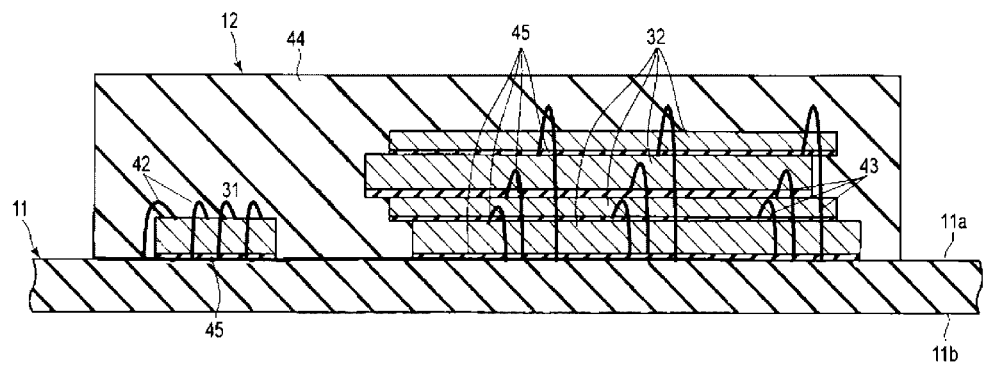
FIG. 6 is a cross-sectional view of the semiconductor device according to the first embodiment.

FIG. 6 illustrates a section of the semiconductor package 12. The substrate 11 is, for example, a multilayer interconnect substrate and includes a power supply layer as well as a ground layer not illustrated in FIG. 6. The controller 31 is placed on the first surface 11a of the substrate 11 and, for example, fixed to the substrate 11 by a mount film 45. The controller 31 is electrically connected to the substrate 11 by a bonding wire 42.

The multiple semiconductor memories 32 are stacked on the first surface 11a of the substrate 11. The multiple semiconductor memories 32 are fixed to the substrate 11 by the mount film 45 while being electrically connected to the substrate 11 by a bonding wire 43. The semiconductor memories 32 are electrically connected to the controller 31 through the substrate 11.

Figure 7:
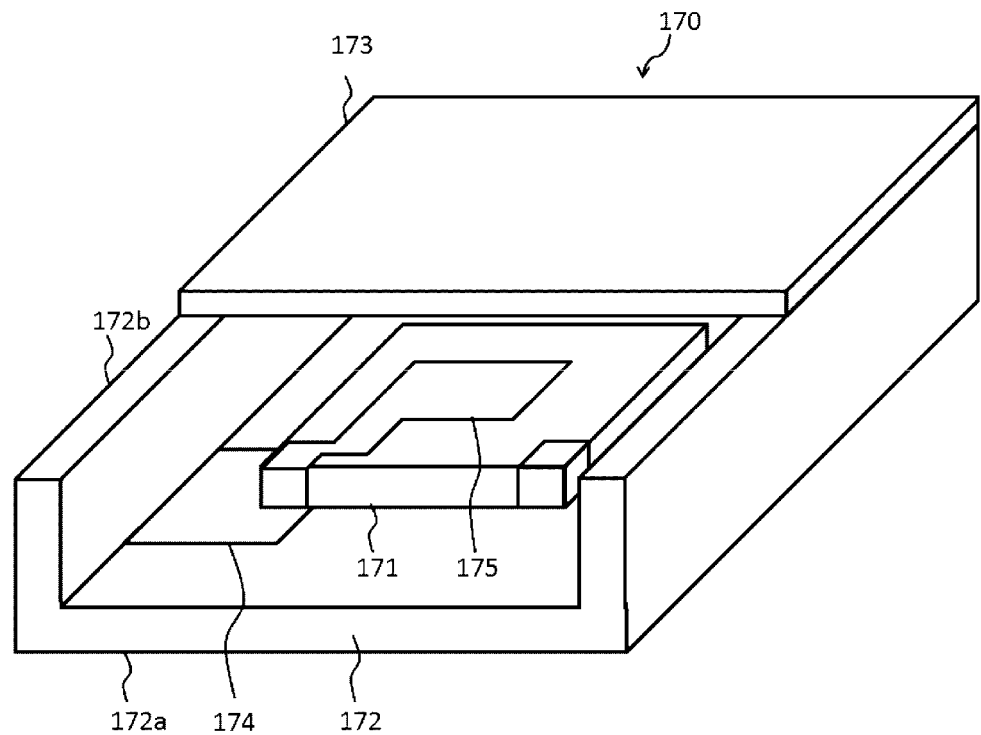
FIG. 7 is a perspective view in which a portion of an oscillator is exposed.

The semiconductor package 12 according to the present embodiment includes the oscillator circuit 37 (not illustrated in FIG. 6). FIG. 7 illustrates a perspective view of a portion of an oscillator 170 that makes up the oscillator circuit 37. The oscillator 170 includes a crystal element 171, a metal substrate 172, a metal lid 173, a first electrode 174, and a second electrode 175. A portion of the metal lid 173 has been removed for illustrative purposes in FIG. 7. The crystal element 171 may be covered with the metal substrate 172 and the metal lid 173, which form the housing of the crystal element 171.

The metal substrate 172 includes a base portion 172a and a side wall portion 172b. The first electrode 174 is arranged in the base portion 172a. The metal substrate 172 is made of, for example, alumina, but is not limited thereto.

The crystal element 171 is fixed to the metal substrate 172 by, for example, a conductive adhesive while being electrically connected to the first electrode 174. In other words, the first electrode 174 arranged in the metal substrate 172 is electrically connected to the second electrode 175 arranged in the crystal element 171 by the conductive adhesive.

The conductive adhesive desirably includes an elastic material, such as a silicon resin, as a base material. Accordingly, external stress exerted on the crystal element 171 can be alleviated.

A connection unit (not illustrated) is arranged in the metal substrate 172, and at least a portion of the connection unit is electrically connected to the first electrode 174. The oscillator 170 is electrically connected to the substrate 11 through the connection unit and is further electrically connected to the controller 31 through an interconnect arranged in the substrate 11.

The metal lid 173 is bonded to the side wall portion 172b of the metal substrate 172 by an adhesive. The adhesive is, for example, an epoxy resin but is not limited thereto. Generally, the metal lid 173 includes a material that is less hard than the metal substrate 172.

Figure 8:
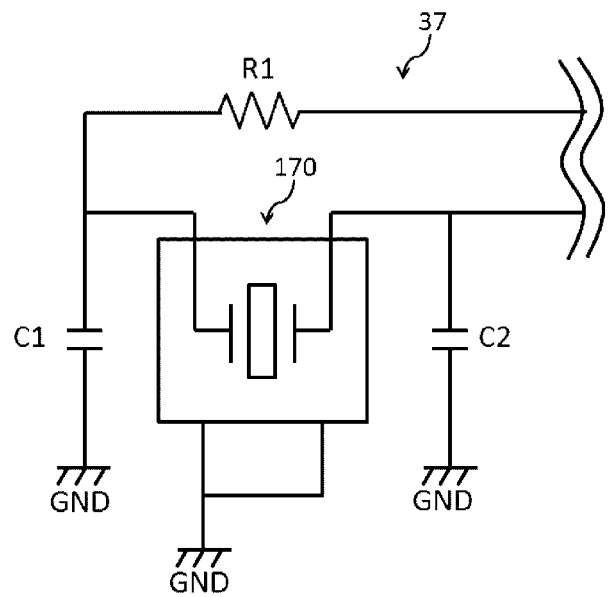
FIG. 8 is a circuit diagram of an oscillator circuit in the semiconductor device.

FIG. 8 is a circuit diagram of the oscillator circuit 37 employed in the semiconductor device 1 according to the present embodiment. The oscillator circuit 37 includes the oscillator 170, a capacitor C1, a capacitor C2, and a resistor R1, and the oscillator circuit 37 is included in the semiconductor package 12.

The oscillator 170, the capacitor C1, the capacitor C2, and the resistor R1 are mounted on the first surface 11a of the substrate 11. An internal interconnect (not illustrated) of the substrate 11 or a conducting wire or the like may be employed as an interconnect for connecting the oscillator 170, the capacitor C1, the capacitor C2, and the resistor R1.

A ground layer (not illustrated) is arranged in the substrate 11. The interconnect connecting the oscillator 170 and the controller 31 is desirably arranged in the ground layer arranged in the substrate 11. Accordingly, the interconnect is sealed by the ground layer, and the operational stability of the oscillator 170 can be improved.

A seal unit 44 (molding material) is arranged on the first surface 11a of the substrate 11. The electronic components mounted on the first surface 11a of the substrate 11 such as the power supply component 24, the controller 31, the multiple semiconductor memories 32, the bonding wires 42 and 43, the DRAM 33, the EEPROM 35, the temperature sensor 36, the oscillator circuit 37, resistors, and capacitors, are collectively sealed (integrally covered) by the seal unit 44.

Figure 9:
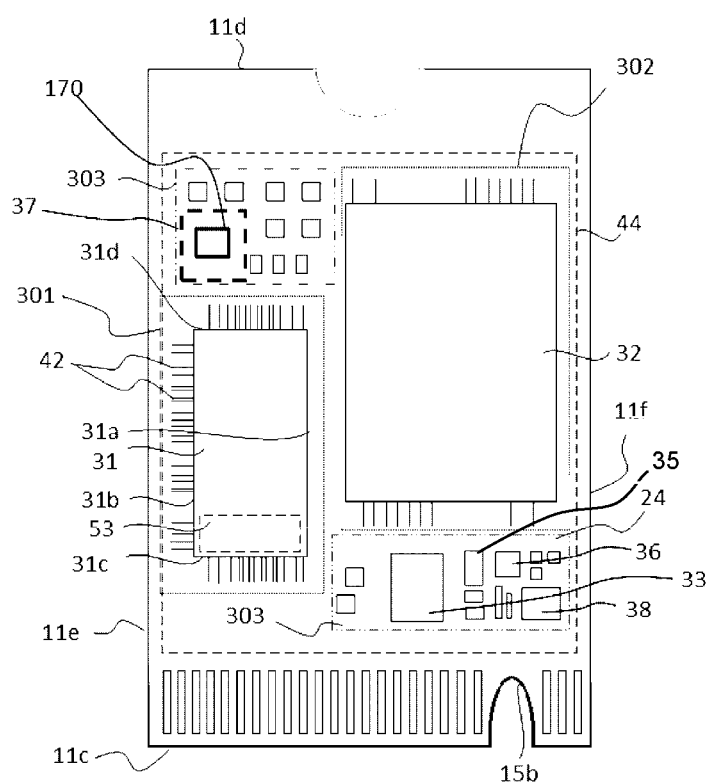
FIG. 9 is a top view of the semiconductor package.
Figure 10:
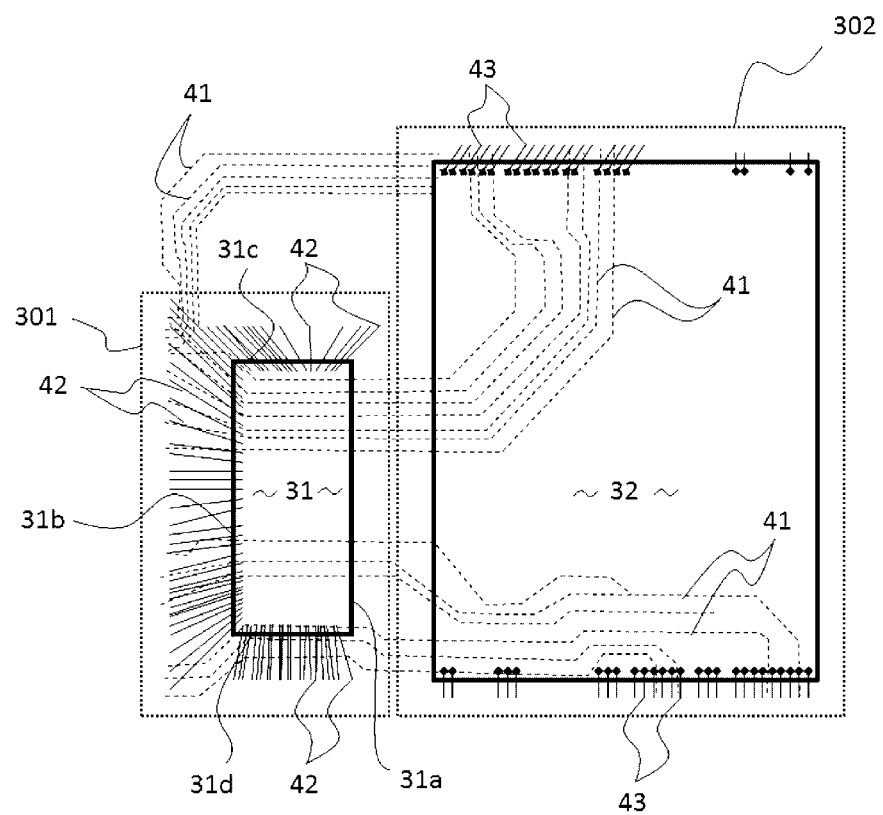
FIG. 10 is a top view of an interconnect between a controller and a semiconductor memory in the semiconductor device according to the first embodiment.

FIG. 9 is a plan view of the semiconductor device 1 viewed from the first surface 11a side of the substrate 11. The seal unit 44, however, is omitted for illustrating an internal configuration of the semiconductor package 12. FIG. 10 illustrates an interconnect configuration in a region around the controller 31 and the semiconductor memory 32. As illustrated in FIG. 9 and FIG. 10, the controller 31 has a substantially rectangular shape and includes a longitudinal first edge portion 31a, a second edge portion 31b opposite to the first edge portion 31a, a transverse third edge portion 31c, and a fourth edge portion 31d opposite to the third edge portion 31c in the present embodiment.

The first edge portion 31a is positioned on the side of the controller 31 adjacent to the semiconductor memory 32 side mounted on the substrate 11, and the third edge portion 31c is positioned toward the interface unit 15 side arranged in the substrate 11.

A first mount region 301 where the controller 31 is mounted, a second mount region 302 where the semiconductor memory 32 is mounted, and a third mount region 303 that is a region excluding the first mount region 301 and the second mount region 302 where components other than the controller 31 and the semiconductor memory 32 are mounted are arranged in the region covered with the seal unit 44 inside the semiconductor package 12 as illustrated in FIG. 9.

Components such as resistors and capacitors, the oscillator circuit 37, a load switch 38, and the like are mounted in the third mount region 303, and these components are mounted separately from each other. The third mount region 303 is arranged at each of a location positioned on the first edge portion 11c side of the substrate 11 and a location positioned on the second edge portion 11d side thereof in the present embodiment. In one of the regions closer to the interface unit 15 as a connector, electronic components configuring the power supply circuit 24 are concentrated, and components such as the temperature sensor 36 and the load switch having a mount height higher than other capacitors, resistors, and the like are arranged. The term "mount height" referred herein means the height of the substrate 11 in the thickness direction when components are mounted on the substrate 11.

The controller 31 according to the present embodiment, for example, includes a connection terminal to which the bonding wires 42 are connected at each of the second edge portion 31b, the third edge portion 31c, and the fourth edge portion 31d, which are the three edge portions excluding the first edge portion 31a, as illustrated in FIG. 9. The controller 31 is electrically connected to other various electronic components including the substrate 11 through these connection terminals.

By not disposing a connection terminal in the first edge portion 31a of the controller 31, the distance between the adjacent semiconductor memories 32 can be smaller, and the size of the semiconductor device 1 can be reduced as a result. Workability also improves when the bonding wires 42 are densely arranged during manufacturing.

The controller 31 generally generates a larger amount of heat than other electronic components including the semiconductor memory 32. Therefore, the heat generated by the controller 31 is dissipated toward the substrate 11 through the bonding wires 42 that have a high thermal conductivity in the present embodiment.

The operational performance of the semiconductor memory 32 changes depending on the ambient temperature. Particularly, continuous driving of the semiconductor memory 32 in a high-temperature environment promotes fatigue, thereby resulting in the possibility of reducing storage performance.

As illustrated in FIG. 10, the bonding wires 42 are not arranged on the first edge portion 31a side of the controller 31, and the controller 31 does not include a connection terminal connected to the substrate 11 at the edge portion of the first edge portion 31a in the present embodiment.

Therefore, transmission of heat from the controller 31 to the semiconductor memory 32 through the dense bonding wires 42 can be avoided. That is, heat dissipation from the first edge portion 31a side of the controller 31 that is closest to the semiconductor memory 32, which tends to have performance degradation due to heat, is suppressed, and influence of the heat generated by the controller 31 on the semiconductor memory 32 can be reduced.

The bonding layers 42 that are electrically connected to the semiconductor memory 32 through an interconnect pattern 41 is concentrated on the second edge portion 31b side of the controller 31 as illustrated in FIG. 10 in the present embodiment. By concentrating connection terminals in one of the four edge portions that is farthest from the semiconductor memory 32, transmission of heat from the controller 31 to the semiconductor memory 32 can be further suppressed.

By concentrating the bonding wires 42 of the controller 31 at both ends of the second edge portion 31b, that is, on each of the third edge portion 31c side and the fourth edge portion 31d side of the controller 31 in the present embodiment, the distance between the bonding wires 42 and the bonding wires 43 arranged at both ends of the semiconductor memory 32 can be reduced, and the length of the interconnect pattern 41 can be decreased. In addition, the interconnect pattern 41 can avoid passing through the central portion of the semiconductor memory 32. Accordingly, the interconnect pattern 41 that is made of metal and concentrated at the central portion of the semiconductor memory 32 can be prevented, and this contributes to reduction of heat transfer to the semiconductor memory 32.

Figure 11:
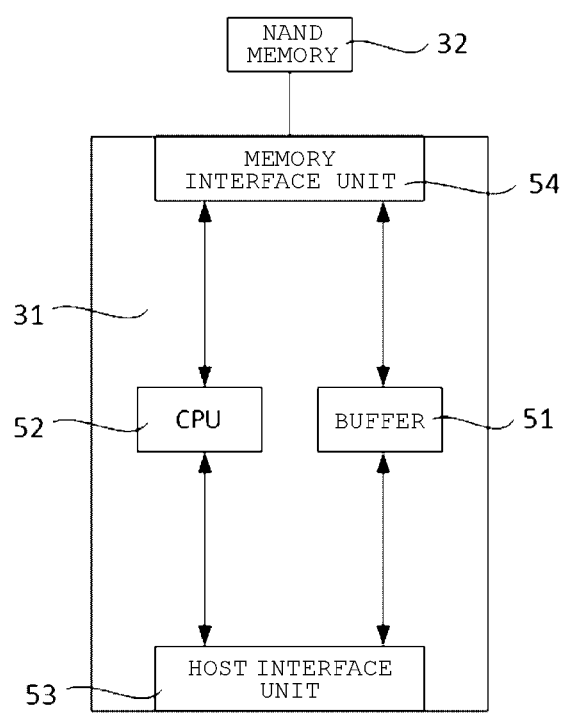
FIG. 11 is a block diagram of the controller.

FIG. 11 illustrates a system configuration of the controller 31. The controller 31 includes a buffer 51, a central processing unit (CPU) 52, a host interface unit 53, and a memory interface unit 54 as illustrated in FIG. 11.

The buffer 51 temporarily stores a certain amount of data either when data transmitted from the host apparatus 2 are written into the semiconductor memory 32 or when data read from the semiconductor memory 32 are transmitted to the host apparatus 2.

The CPU 52 controls the entire semiconductor package 12 and the semiconductor device 1. The CPU 52, for example, either receives a write command, a read command, and an erase command from the host apparatus 2 to access the corresponding region of the semiconductor memory 32 or controls data transfer through the buffer 51.

The host interface unit 53 is positioned between the interface unit 15 of the substrate 11 and the CPU 52, and between the interface unit 15 and the buffer 51. The host interface unit 53 provides an interface between the controller 31 and the host apparatus 2. A high-speed signal complying with the PCIe standard, for example, is transmitted between the host interface unit 53 and the host apparatus 2.

The host interface unit 53 is arranged alongside the third edge portion 31c of the controller 31. In this case, an interconnect between the host interface unit 53 and the interface unit 15 of the substrate 11 can have a substantially shortest length from the controller.

If, for example, the host interface unit 53 is arranged alongside the fourth edge portion 31d of the controller 31, the length of the interconnect increases by the longitudinal length of the controller chip. The lengthening of the interconnect increases parasitic capacitance, parasitic resistance, parasitic impedance, and the like, thereby changes characteristic impedance of the signal interconnect. In addition, a signal delay may be caused.

From the above viewpoint, the host interface unit 53 according to the present embodiment is desirably arranged alongside the third edge portion 31c of the controller 31, and accordingly, the operational stability of the semiconductor device 1 is improved.

The memory interface unit 54 is positioned between the semiconductor memory 32, the CPU 52, and the buffer 51. The memory interface unit 54 provides an interface between the controller 31 and the semiconductor memory 32.

Next, a method for manufacturing the semiconductor device according to the present embodiment will be described. First, the mount film 45 having a substantially rectangular shape is bonded to a predetermined position on the first surface 11a of the substrate 11. At this time, the mount film 45 is bonded such that the long edge of the mount film 45 and the long edge of the substrate 11 are in the same direction.

Next, the controller 31 is positioned on the mount film 45 such that the host interface unit 53 is positioned on the interface unit 15 side of the substrate 11. The controller 31 is fixed to the first surface 11a of the substrate 11 by the mount film 45.

Figure 12:
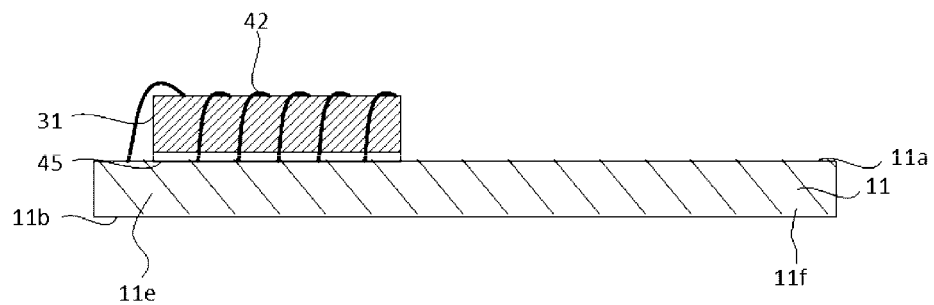
FIGS. 12-14 are cross-sectional views of a substrate to illustrate a manufacturing process of the semiconductor device.

The controller 31 is electrically connected to the substrate 11 by the bonding wires 42 as illustrated in FIG. 12. At this time, the bonding wires 42 are not connected from the first edge portion 31a side of the controller 31 to the substrate 11 as shown in FIG. 9. Accordingly, the controller 31 is mounted on the first surface 11a of the substrate 11.

Next, the mount film 45 is separated from the controller 31 by a predetermined distance and is bonded to the first edge portion 31a of the controller 31. At this time, the mount film 45 is bonded such that the long edge of the mount film 45 and the long edge of the substrate 11 are in the same direction. The term "predetermined distance" means a distance shorter than the distance that is necessary if a bonding wire is also provided on the first edge portion 31a of the controller 31.

Figure 13:
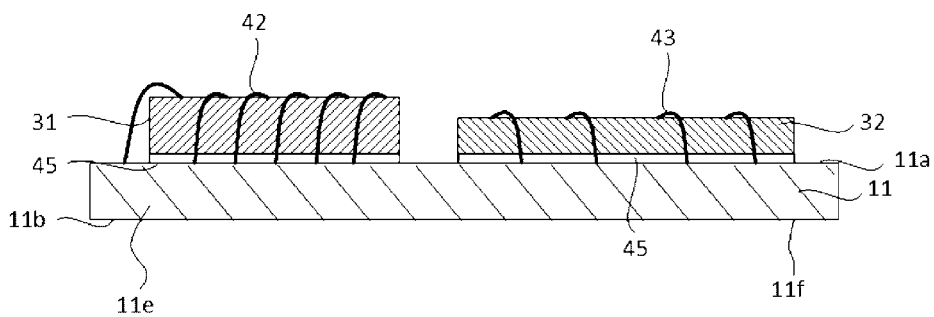

Subsequently, the semiconductor memory 32 is disposed on the mount film 45. The semiconductor memory 32 is fixed onto the first surface 11a of the substrate 11 by the mount film 45. In addition, the semiconductor memory 32 is electrically connected to the substrate 11 by the bonding wire 43. This process is illustrated in FIG. 13.

Figure 14:
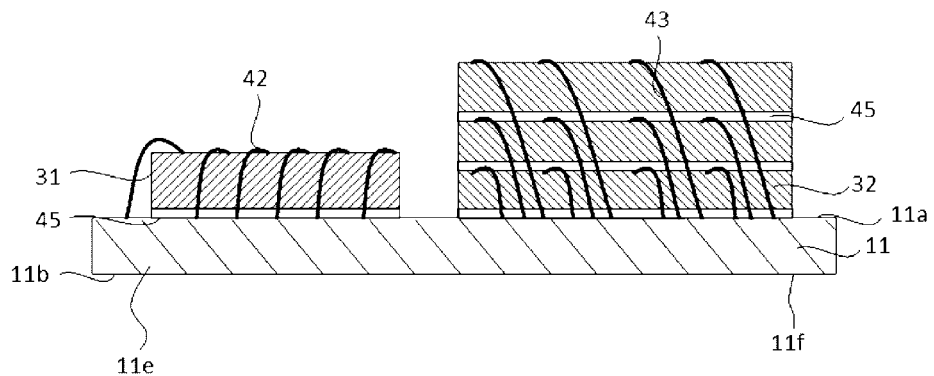

A new mount film 45 is bonded onto the semiconductor memory 32, and the semiconductor memory 32 is again stacked thereon. By so doing repeatedly, multiple semiconductor memories 32 are stacked and mounted on the first surface 11a of the substrate 11 as illustrated in FIG. 14.

Each of the multiple semiconductor memories 32 stacked is electrically connected to the substrate 11 by the bonding wires 43. The multiple semiconductor memories 32 stacked are also connected to each other by the bonding wires 43.

The method of bonding the mount film 45 to the first surface 11a of the substrate 11 is not limited to the one described above. The mount film 45, for example, may be bonded to a wafer employed in the controller 31, and the wafer may be diced into individual chips (controller 31). The same applies in the case of the semiconductor memory 32.

Accordingly, positioning of the controller 31 and the semiconductor memories 32 becomes easier when the controller 31 and the semiconductor memories 32 are mounted on the first surface 11a of the substrate 11, and this can contribute to simplification of manufacturing.

Next, other electronic components (the power supply component 24, the DRAM 33, the EEPROM 35, the temperature sensor 36, the oscillator circuit 37, resistors, capacitors, and the like) are mounted in a component mount region on the first surface 11a of the substrate 11. At this time, electronic components are desirably not mounted between the host interface unit 53 of the controller 31 and the interface unit 15 of the substrate 11.

As described above, if the length of the interconnect between the host interface unit 53 and the interface unit 15 is long, the impedance of the signal interconnect may change and a signal delay may be caused. Therefore, mounting of electronic components between the host interface unit 53 and the interface unit 15 is not desirable in order to make the length of the interconnect connecting the host interface unit 53 and the interface unit 15 the shortest, that is, to straighten the interconnect.

Electronic components such as the power supply component 24 and the DRAM 33 may cause noise during operation. By not mounting these electronic components between the host interface unit 53 and the interface unit 15, a signal exchanged between the host interface unit 53 and the interface unit 15 is less likely to include noise, and the operational stability of the semiconductor device 1 can be improved.

For the same reason, electronic components such as the power supply component 24 and the DRAM 33 are desirably not mounted between the memory interface unit 54 of the controller 31 and the semiconductor memories 32 mounted on the substrate 11. Generally, the DRAM 33 is preferably located at the vicinity of the controller 31.

As described above, the power supply component 24 generates a predetermined voltage required for the semiconductor package 12 and the like from the power supplied from the host apparatus 2. Therefore, the power supply component 24 is desirably located at the vicinity of the interface unit 15 so as to suppress loss of power supplied from the host apparatus 2.

The oscillator circuit 37 is connected to the controller 31 in the present embodiment. The oscillator circuit 37 is desirably located at the vicinity of the controller 31 so as to decrease the length of the interconnect between the oscillator circuit 37 and the controller 31.

Electronic components such as the power supply component 24 and the DRAM 33 that cause noise during operation are desirably not mounted in the vicinity of the oscillator circuit 37. If a clock signal handled by the oscillator circuit 37 is caused to contain noise, the noise may negatively influence on the operation of the controller 31, thereby possibly causing unintended error.

Therefore, the oscillator circuit 37 according to the present embodiment is mounted in the vicinity of the controller 31 and apart from the power supply component 24 and the DRAM 33 as illustrated in FIG. 9. The position where the oscillator circuit 37 is mounted is not limited to the position shown in FIG. 9.

The interconnect connecting the oscillator circuit 37 and the controller 31 is desirably shielded by a ground (not illustrated) on the substrate 11. For example, by shielding the interconnect on the substrate 11, the operational stability of the oscillator circuit 37 can be improved. Furthermore, influence of the external noise can be minimized also when many components are mounted near the central portion of the semiconductor package 12 and the interconnect is laid out on the edge portion side.

"Vicinity" in the present embodiment means within a short distance in which one (no more than one) semiconductor component such as a ball grid array (BGA) or a land grid array (LGA) or one circuit can be mounted. When, specifically, the vicinity of a certain structure is mentioned, the vicinity indicates a region that extends from the periphery of the structure to the distance in which one (no more than one) semiconductor component or one (no more than one) circuit can be arranged or mounted.

Therefore, "vicinity of the interface unit 15", for example, indicates a region around the portion of the substrate 11 configuring the interface unit 15 including the power supply component 24 in the present embodiment.

Finally, all of the electronic components mounted on the first surface 11a of the substrate 11 are sealed (molded). The sealing is performed with resin in the present embodiment. The resin (molding material) employed in the resin sealing is, for example, a thermosetting epoxy resin, but is not limited thereto.

Figure 15:
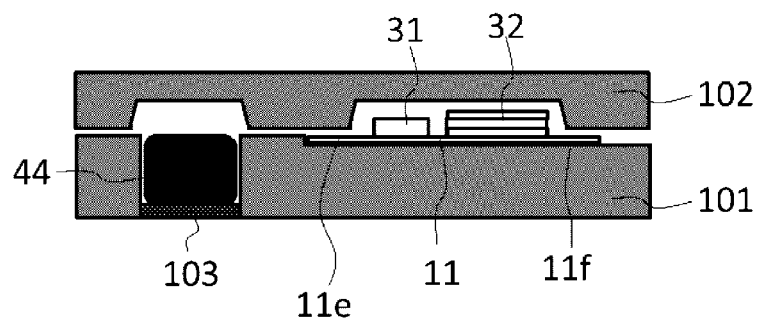
FIGS. 15-17 illustrate a sealing process of the semiconductor device.
Figure 16:
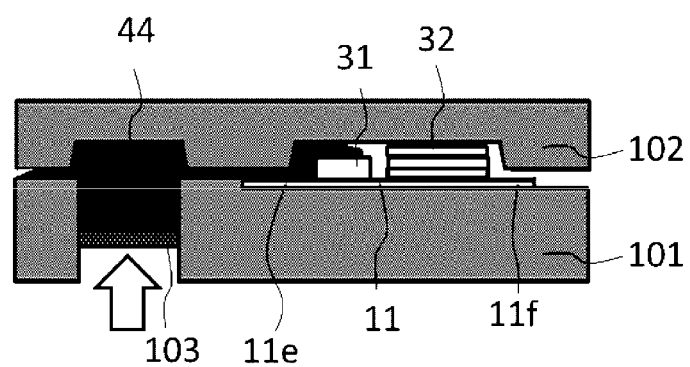
Figure 17:
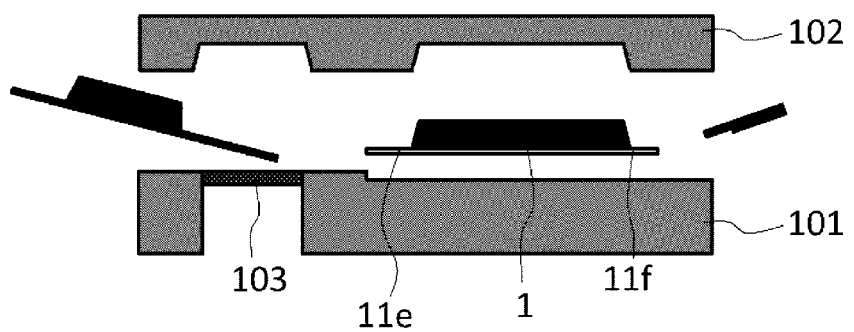

The sealing procedure in the manufacturing of the semiconductor device according to the present embodiment is illustrated in FIG. 15 to FIG. 17. The molding material 44 is injected from a third edge portion 11e side to a fourth edge portion 11f side of the substrate 11 in the present embodiment. For that reason, the molding material 44 is unlikely to contact the interface unit 15 of the substrate 11 and affect the function, characteristics, and the like of the interface unit 15.

First, the substrate 11 and the molding material 44 are placed in a first mold 101 and are disposed between the first mold 101 and a second mold 102 as illustrated in FIG. 15. A surface 103 of the first mold 101 on which the molding material is placed can move up and down.

Next, the surface 103 is pressed up while the molding material 44 is heated to be melted, and the molding material 44 flows toward the substrate 11 as illustrated in FIG. 16. Then, the molding material 44, when completely flowing into the entire mold, is left for a while to be cooled. After time elapses, the molding material 44 is fixed onto the substrate 11, and the molding material 44 in a fluid phase solidifies.

Finally, by taking the substrate 11 from the mold and removing (by deburring) extraneous molding material as illustrated in FIG. 17, the semiconductor device 1 in which all components mounted on the substrate 11 are sealed by the molding material 44 and the semiconductor package 12 is mounted on the substrate 11 is manufactured.

The molding material 44 flows from the controller 31 toward the multiple stacked semiconductor memories 32, which have a mount height higher than the controller 31 as illustrated in FIG. 15 to FIG. 17. Components such as the temperature sensor 36 and the load switch 38 having a mount height higher than capacitors, resistors, and the like are arranged on the fourth edge portion 11f side of the substrate 11 when viewed from the center of the substrate 11.

Since the components are arranged in order from lowest mount height to highest mount height in the direction of flow of the molding material 44, the speed of flow of the molding material 44 applied onto the substrate 11 does not easily drop until the molding material 44 reaches the fourth edge portion 11f. The molding material 44 is not likely to reach the side surface of the stacked semiconductor memories 32, the flow rate thereof is not likely to significantly decrease, and voids are less likely to be suppressed.

The components such as resistors and capacitors mounted in the third mount region 303 of the substrate 11 are separated from each other by a predetermined distance as described above. If these components are disposed close to each other, the molding material may not flow into the gap between the components, thereby possibly generating a void. The molding material is not bonded to the substrate at the portion where a void is generated, and a problem arises in mount reliability. For this reason, components such as resistors and capacitors are desirably mounted separately from each other so that voids are not generated, and the distance between the separated components, for example, is longer than the distance between the bonding wires 42 and 43 or than the distance between adjacent solder balls.

Recently, there are demands for smaller size and thickness as well as high-density mounting in the semiconductor device 1, for example, an external dimension of 22 mm×30 mm and single-side mounting.

A semiconductor device in which a controller and a semiconductor memory are individually mounted on a substrate is considered herein for comparative purposes. In such a semiconductor device, if the controller and the semiconductor memory are arranged in individual packages on the substrate having a small size (for example, M.2-2230), the controller and the semiconductor memory may not fit within a component mount region.

In contrast, the semiconductor package 12 is configured as a so-called SiP component in which all of the electronic components such as the controller 31, the semiconductor memories 32, and the DRAM 33 are collectively sealed by the seal unit 44 in the present embodiment. According to such a configuration, even if the substrate 11 has a small size, the controller 31 and the semiconductor memories 32 can be densely arranged.

All of the components including the controller 31 and the semiconductor memories 32 are collectively sealed by the semiconductor package 12, and the substrate mount components are mounted on the first surface 11a while the second surface 11b is designed as a non-component mount surface on which no substrate mount components are mounted in the present embodiment. Accordingly, the thickness of the semiconductor device 1 according to the present embodiment can be smaller in comparison with the structure in which the substrate mount components protruding from the surface are mounted on both sides of the substrate 11.

The controller 31 mounted on the substrate 11 is electrically connected to the substrate 11 without a BGA in the present embodiment. When the BGA is used, solder balls would be arranged over the entire substrate and conduction occurs from the bottom surface of the controller 31 contacting the substrate 11 to the substrate and to other electronic components through the solder balls. In contrast, the electrical connection between the substrate 11 and the controller 31 is provided by the bonding wires 42 in the present embodiment. Thus, the efficiency in heat transfer from the controller 31 to the substrate 11 drops in comparison with the heat transfer through the solder balls, and the semiconductor memories 32 are not easily affected by the heat dissipated from the controller 31.

The substrate 11 according to the present embodiment is a printed substrate configured of a material such as a glass epoxy resin as described above and may be deformed in response to a temperature change. When the BGA were used in the present embodiment, the substrate 11 thermally would expand from the portion having a high temperature such as the surface portion facing the controller 31 and the portion bonded to the solder ball, and strain would occur from the region where the controller 31 is mounted. In addition, since the substrate 11, the package substrate of the controller 31, and the package substrate of the semiconductor memory 32 have different thermal expansion coefficients, stress may be concentrated on the solder balls fixed therebetween, thus possibly causing melting, cracking, or the like of the solder balls.

According to the present embodiment, the substrate 11 and the electronic components such as the controller 31 are connected by bonding wires without package substrates and solder balls. In addition, the substrate 11 and the electronic components such as the controller 31 are fixed by the mount film 45. As a result, the semiconductor device 1 according to the present embodiment has improved mount reliability without a problem such as melting or cracking of the solder balls.

The semiconductor device 1 according to the present embodiment is, for example, an SSD, and may be carried to various places because of the portability thereof. In addition, the semiconductor device 1 may stay connected to the host apparatus. In such cases, dust or the like in the air may be attached to the semiconductor device 1. However, since the electronic components mounted on the substrate 11 are collectively sealed according to the present embodiment, each electronic component is less likely to be affected by dust.

The semiconductor device 1 according to the present embodiment has a structure in which the semiconductor package directly contacts the substrate 11 as described above. Thus, the terminals connecting the semiconductor package and the substrate 11 are not exposed, and a signal may not be able to be detected from the terminals.

The oscillator circuit 37 and the controller 31 are collectively sealed as the semiconductor package 12 in the present embodiment. The semiconductor device 1 (semiconductor package 12) is manufactured such that compatibility between the controller 31 and the oscillator circuit 37 is secured and the controller 31 and the oscillator circuit 37 are sealed. Thus, there is no need to provide compatibility between the oscillator circuit 37 and various types of controllers.

If the oscillator circuit 37 is mounted outside the semiconductor device 1 (that is, on the motherboard 205 or the like illustrated in FIG. 2 and FIG. 3), the oscillator circuit 37 in the host apparatus 2 may not be compatible with the controller 31 in the semiconductor device 1.

Since the oscillator circuit 37 and the controller 31 are collectively sealed as the semiconductor package 12 in the present embodiment, the compatibility issue between the controller 31 and the oscillator circuit 37 can be solved.

Furthermore, by not mounting the oscillator circuit 37 on the motherboard 205 or the like of the host apparatus 2, which is connected to the semiconductor device 1, the size of the circuits of the host apparatus 2 can be reduced, and this may contribute to reduction of the size of the host apparatus 2.

In addition, there is no need to dispose the connection terminals 15a for operating the oscillator circuit 37 in the interface unit 15 connected to the motherboard 205. Therefore, the number of terminals connecting the semiconductor device 1 and the motherboard 205 can be reduced.

The metal substrate 172 of the oscillator 170 includes the side wall portion 172b as illustrated in FIG. 7 in the present embodiment. Accordingly, the durability of the oscillator 170 against physical load is improved.

Here, it is assumed that the metal substrate 172 does not include the side wall portion 172b and that the crystal element 171 mounted on the metal substrate 172 (base portion 172a) is covered with the metal lid 173. In this case, the metal lid 173 may be pressed and crushed by the molding material 44 during the sealing illustrated in FIG. 15 to FIG. 17.

In contrast, the metal substrate 172 of the present embodiment has the side wall portion 172b. Thus, the crystal element 171 can be protected from the molding material 44, and the oscillator 170 (oscillator circuit 37) can be mounted inside the semiconductor package 12.

While the first embodiment and modification examples are described thus far, the embodiment related to the semiconductor device 1 is not limited thereto. Next, a semiconductor device according to a second embodiment will be described. Configurations having the same or similar function as the configuration of the first embodiment will be described with the same reference sign and will not be described in detail. In addition, configurations other than those described below are the same as the first embodiment.

Second Embodiment

The semiconductor device 1 according to the first embodiment includes components that are mounted only on the first surface 11a of the substrate 11 as described above. Accordingly, the semiconductor device 1 can have a small thickness and thus occupies less space. Alternatively, one or more components may be mounted on the second surface 11b of the substrate. In the present embodiment, a test pad is arranged on the rear surface of the substrate, such that product performance can be checked.

Figure 18:
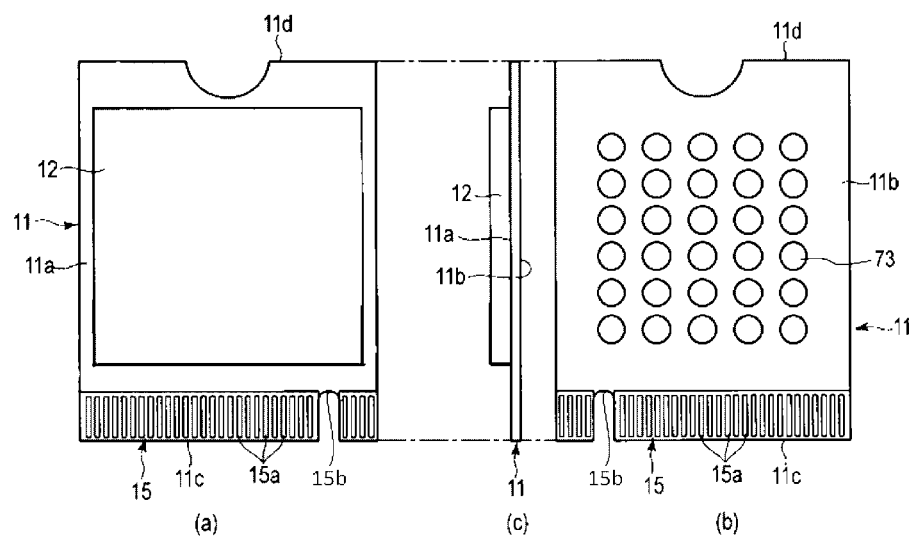
FIG. 18 illustrates a semiconductor device according to a second embodiment, where (a) is a front view, (b) is a rear view, and (c) is a side view.
Figure 19:
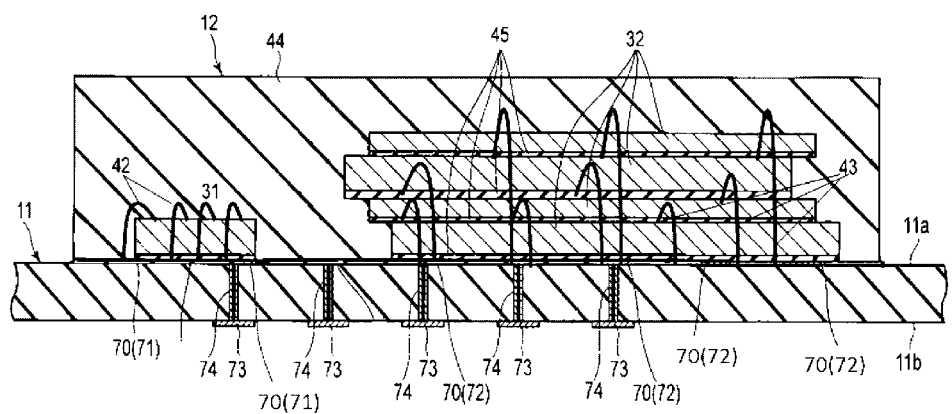
FIG. 19 is a cross-sectional view of the semiconductor device according to the second embodiment.

A specific example of the semiconductor device 1 according to the present embodiment is illustrated in FIG. 18. (a) of FIG. 18 is a plan view, (b) of FIG. 18 is a bottom view, and (c) of FIG. 18 is a side view of the semiconductor device 1. FIG. 19 is a cross-sectional view of the semiconductor package 12.

The bonding wires 42 and 43 of the semiconductor package 12 include multiple bonding wires. The multiple bonding wires are electrically connected to the inside of the controller 31 through the host interface unit 53. A control signal or a data signal as a PCIe high-speed signal flows in several wires of the bonding wires 42 from the host apparatus 2. A power supply current is supplied through other several wires of the bonding wire 42.

The bonding wires 42 in which a signal flows, for example, are arranged near the interface unit 15 of the substrate 11, that is, on the third edge portion 31c of the controller 31. Accordingly, the length of the interconnect between the bonding wires 42 and the interface unit 15 of the substrate 11 can be decreased, and the high-speed operability of the semiconductor package 12 can be improved.

Meanwhile, the bonding wires 43 are not connected to the host interface unit 53. Several wires of the bonding wires 43 are electrically connected to the inside of the controller 31 without passing through the host interface unit 53. Other several wires of the bonding wires 43 are electrically connected to a test input terminal of the semiconductor package 12.

More specifically, the bonding wires 43 can be electrically connected to the memory interface unit 54 inside the controller 31 without passing through the host interface unit 53. That is, at least one of the bonding wires 43 is electrically connected to the memory interface unit 54 without passing through the host interface unit 53 by, for example, switching electrical connection inside the controller 31 during, for example, the test operation of the semiconductor package 12.

From another viewpoint, at least one of the bonding wires 43 can be electrically connected to the memory interface unit 54 of the controller 31 without passing through the CPU 52 and the buffer 51. That is, at least one of the bonding wires 43 is electrically connected to the memory interface unit 54 without passing through the CPU 52 and the buffer 51 by, for example, switching electrical connection inside the controller 31 during, for example, the test operation of the semiconductor package 12.

The first surface 11a of the substrate 11 includes multiple pads 70 that are electrically connected to the bonding wires 42 and 43 of the semiconductor package 12 as illustrated in FIG. 19. The multiple pads 70 include multiple first pads 71 and multiple second pads 72. The first pads 71 are electrically connected to the interface unit 15 of the substrate 11. The first pads 71 are respectively connected to the bonding wires 42. The second pads 72 are electrically insulated from the interface unit 15 of the substrate 11. The second pads 72 are electrically connected to the second bonding wires 43.

The second surface 11b of the substrate 11 includes multiple third pads 73 as illustrated in FIG. 18. The multiple third pads 73 are arranged in correspondence with the multiple second pads 72. That is, the size and arrangement of the multiple third pads 73 are substantially the same as the size and arrangement of the multiple second pads 72. In other words, the third pads 73 are positioned immediately below the surface where the second pads 72 are arranged. The multiple third pads 73 are positioned on the other side of the substrate 11 from the region covered with the semiconductor package 12.

Figure 20:
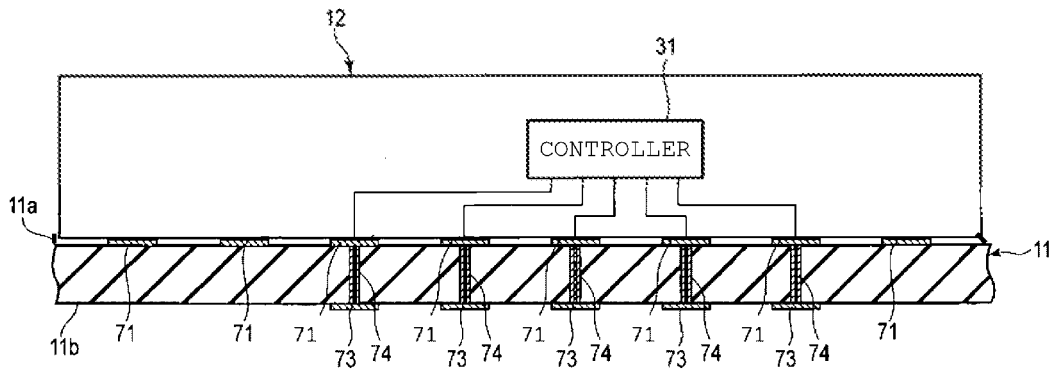
FIG. 20 is a cross-sectional view of the semiconductor device according to the second embodiment, focusing on an electrical connection relationship thereof.

FIG. 20 schematically illustrates an electrical connection relationship between the substrate 11 and the semiconductor package 12. The substrate 11 includes a connection unit 74 that electrically connects the multiple second pads 72 and the multiple third pads 73 one-to-one. The connection unit 74 is, for example, a through hole or a via. Accordingly, the multiple third pads 73 are electrically connected to the multiple second pads 72 respectively. That is, each of the multiple third pads 73 is electrically connected to the controller 31 through the connection unit 74, the first pad 71, and the bonding wire 42.

The third pads 73 are an example of "test pads". That is, a test command (test signal) is input into the controller 31 through the third pads 73 when the semiconductor device 1 is tested. For example, determination of whether writing or reading is normally performed on the semiconductor memories is performed by inputting the test command into the controller 31 through the third pads 73 and obtaining a response to the test command from the third pads 73.

More specifically, the controller 31 and the semiconductor memories 32, for example, can be individually operated on the basis of the test command that is input from at least one of the third pads 73. By inputting various test commands into the third pads 73, the functionality and reliability of the semiconductor device 1 such as whether the controller 31 operates normally, whether the semiconductor memories 32 operate normally, whether the power supply of the semiconductor package 12 functions normally, or whether the semiconductor package 12 as a whole functions normally can be checked.

The number of third pads 73 is greater than the number of first pads 71 in the present embodiment. For example, 20 or more third pads 73 are arranged. Accordingly, many types of test commands can be input into the controller 31, and the test can be performed meticulously.

Test modes for the semiconductor device 1 include, for example, a first mode and a second mode in the present embodiment. The first mode is a state where a unit test is available for the controller 31. Meanwhile, the second mode is a state where, for example, electrical connection inside the controller 31 is switched and where at least one of the third pads 73 is electrically connected to the memory interface unit 54 without passing through the CPU 52 and the buffer 51. That is, the second mode is a state where an access path allowing direct access to the semiconductor memories 32 from at least one of the third pads 73 is set and is a state where a unit test is available for the semiconductor memories 32.

Figure 21:
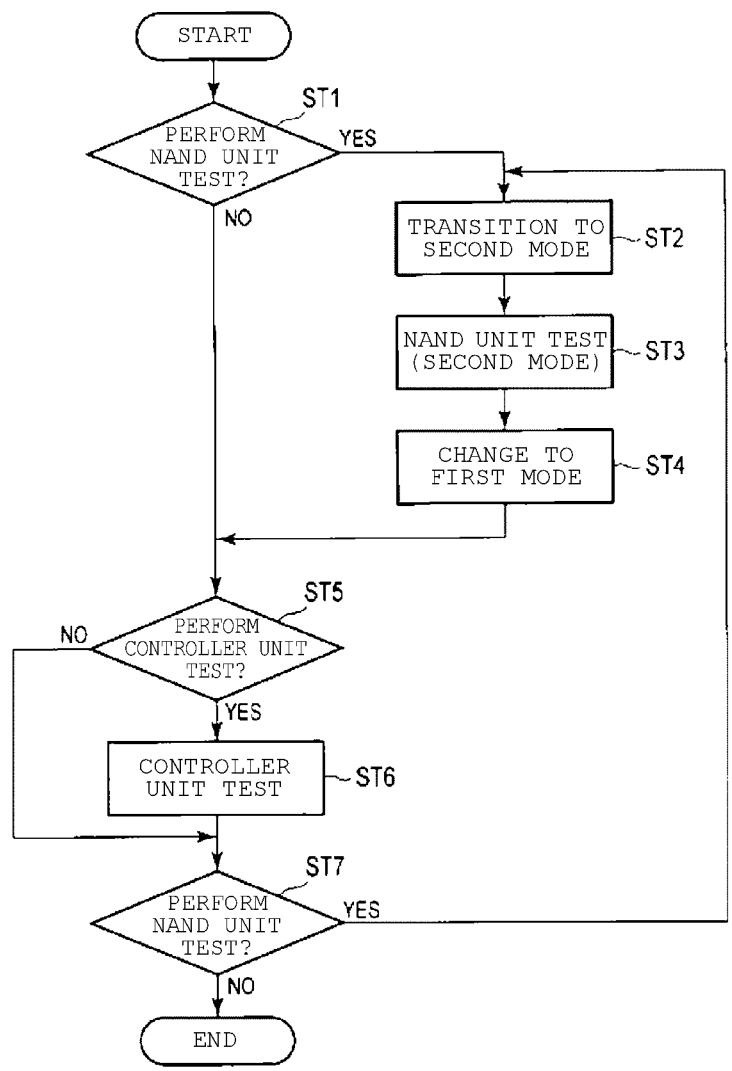
FIG. 21 is a flowchart illustrating a test operation of the semiconductor device according to the second embodiment.

FIG. 21 is a flow chart illustrating a test operation carried out by the semiconductor device 1.

First, in step ST1, the semiconductor device 1 determines whether to perform a unit test of the semiconductor memories 32. The test operation proceeds to step ST2 if the unit test of the semiconductor memories 32 is determined to be performed (YES in step ST1). The test operation proceeds to step ST5 if the unit test of the semiconductor memories 32 is determined to be not performed (NO in step ST1).

In step ST2, the controller 31 sets the operational mode of the controller 31 as the second mode. The test operation proceeds to step ST3 when the operational mode of the controller 31 is set as the second mode. In step ST3, the unit test of the semiconductor memories 32 is performed. In the unit test of the semiconductor memories 32, for example, write data are input from one of the third pads 73, and read data are obtained from the same or different one of the third pads 73. Then, the semiconductor device 1 determines whether a faulty portion is included in the semiconductor memories 32 by checking consistency between the write data and the read data.

As a consequence, faults such as a bit (fail bit) retaining erroneous data and a bit (bad block) where neither writing nor reading can be performed are determined.

The test operation proceeds to step ST4 when the unit test of the semiconductor memories 32 is finished. In step ST4, the controller 31 changes the operational mode thereof to the first mode. The test operation proceeds to step ST5 when the operational mode of the controller 31 is changed to the first mode. In step ST5, the semiconductor device 1 determines whether to perform the unit test of the controller 31. The test operation proceeds to step ST6 if the unit test of the controller 31 is determined to be performed (YES in step ST5). The test operation proceeds to step ST7 if the unit test of the controller 31 is determined to be not performed (NO in step ST5).

In step ST6, the semiconductor device 1 performs the unit test of the controller 31. For example, the unit test is performed by inputting an arbitrary command into the controller 31 from the third pads 73 and checking if the controller 31 responds normally. The test operation proceeds to step ST7 when the unit test of the controller 31 is finished.

In step ST7, the controller 31 determines whether to perform a unit test of the semiconductor memories 32. The test operation returns to step ST2 if the unit test of the semiconductor memories 32 is determined to be performed (YES in step ST7). The test operation ends if the unit test of the semiconductor memories 32 is determined to be not performed (NO in step ST7). The test of the semiconductor device 1 is not limited to the above description. The test may be performed on the entire semiconductor package 12, or other tests may be performed.

Figure 22:
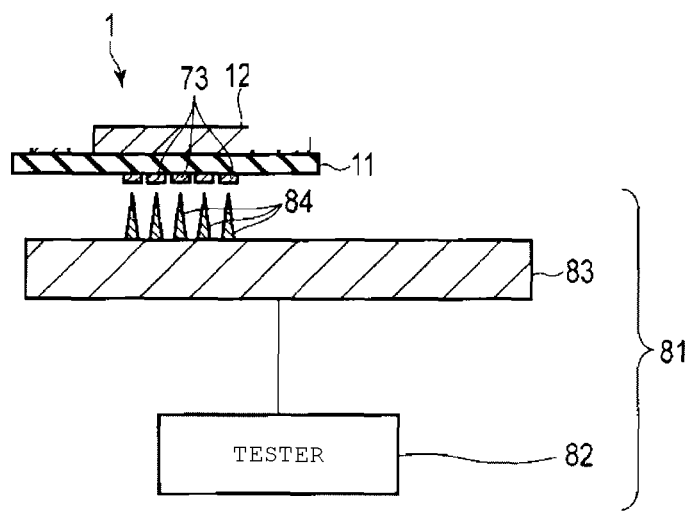
FIG. 22 is a partial cross-sectional view of a test device for the semiconductor device according to the second embodiment.

FIG. 22 illustrates an example of a test device 81 employed in the test of the semiconductor device 1. The test device 81 includes a tester 82, a stage 83, and multiple test pins 84 (probes). The tester 82 is connected to the stage 83. The multiple test pins 84 erect on the stage 83 and are connected to the tester 82 through the stage 83. The multiple test pins 84 are arranged in correspondence with the third pads 73.

The test pins 84 are in contact with the third pads 73 when the semiconductor device 1 is tested. Then, a test command is input into the controller 31 from the tester 82 through the third pads 73, and a response from the controller 31 is determined in the tester 82. Multiple types of tests can be performed on the semiconductor device 1 by, for example, replacing the tester 82. For example, the controller 31 and the semiconductor memories 32 can be separately tested in the semiconductor device 1.

Figure 23:
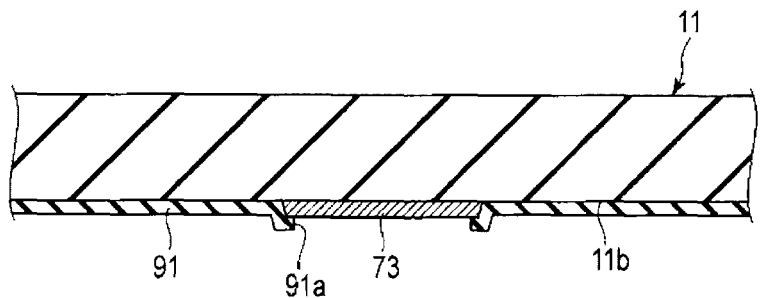
FIG. 23 is a cross-sectional view of a third pad on the semiconductor device according to the second embodiment.

FIG. 23 illustrates an example of the substrate 11. As illustrated in FIG. 23, the third pad 73 may be exposed in an opening portion 91*a* of a solder resist 91, which is arranged on the second surface 11*b* of the substrate 11. The solder resist 91 is an example of "insulating layer" and "insulating unit".

Figure 24:
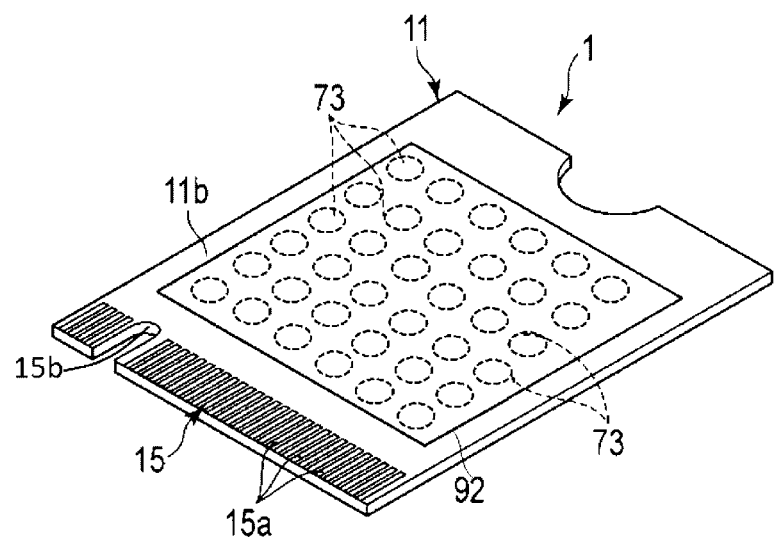
FIG. 24 is a perspective view of a rear surface of the semiconductor device according to the second embodiment.

FIG. 24 illustrates the second surface 11*b* of the substrate 11. As illustrated in FIG. 24, a label 92 by which the multiple third pads 73 are integrally covered may be arranged on the second surface 11*b* of the substrate 11. The label 92 is an example of "sheet", "insulating sheet", and "insulating unit". The label 92 is formed of a material, for example, having more favorable thermal conductivity than the solder resist 91. The label 92 is made of, for example, carbon graphite.

The third pads 73 are connected to the bonding wires 42 of the controller 31 by, for example, the connection unit 74 having excellent thermal conductivity. Thus, a part of heat is likely to move from the controller 31 to the third pads 73. Therefore, the heat removing properties of the semiconductor device 1 can be improved if, for example, the label 92 having more favorable thermal conductivity than the solder resist 91 is arranged.

Figure 25:
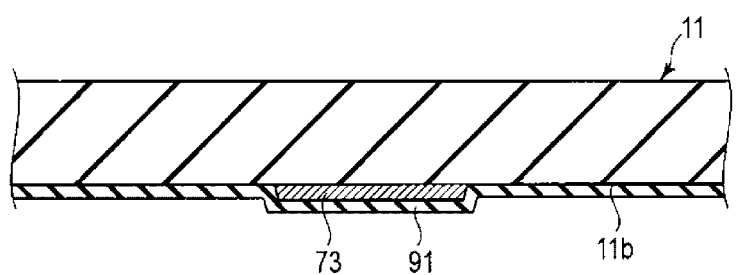
FIG. 25 is a cross-sectional view of the third pad of the semiconductor device according to a modification example of the second embodiment.

FIG. 25 illustrates a modification example of the substrate 11. As illustrated in FIG. 25, the third pad 73 may be covered with the solder resist 91 arranged on the second surface 11*b* of the substrate 11, and the solder resist 91 may be removed to expose the third pad 73 when the third pad 73 is employed. The third pad 73 may be covered by the solder resist 91, for example, after the test is finished.

In the above configuration, the second pad 72 may be referred to as "first pad" and the third pad 73 may be referred to as "second pad" for convenience of description.

According to the semiconductor device 1 having such a configuration, the performance of the semiconductor device 1 and the performance of each component included in the semiconductor device 1 can be checked. That is, the semiconductor device 1 according to the present embodiment includes the substrate 11, the semiconductor package 12, and the pads 72 and 73. The substrate 11 includes the first surface 11*a* and the second surface 11*b* opposite to each other. The pads 72 are arranged on the first surface 11*a* of the substrate 11. The semiconductor package 12 includes the controller 31 and the bonding wires 42 that are electrically connected to the controller 31 through the pads 71. The pads 73 are arranged on the second surface 11*b* of the substrate 11 and electrically connected to the pads 71.

According to such a configuration, operation of the controller 31 and operation of the semiconductor package 12 can be checked by employing the pads 73 arranged on the second surface 11*b* of the substrate 11. By modifying configuration that causes error during the operation, the reliability of the semiconductor device 1 can be improved.

The semiconductor device 1 includes the interface unit 15 arranged in the substrate 11, and a signal flows between the interface unit 15 and the host apparatus 2 in the present embodiment. The pads 72 and 73 are electrically insulated from the interface unit 15. According to such a configuration, direct access to the controller 31 without passing through the interface unit 15 is available. Thus, the test of the controller 31 can be performed.

The controller 31 can be operated based on a test command input from the pads 73 in the present embodiment. According to such a configuration, the test operation of the semiconductor device 1 can be meticulously and easily performed by inputting various test commands into the pads 73. Accordingly, test of the semiconductor device 1 can be facilitated, and the reliability thereof can be improved.

The pads 73 are positioned on the other side of the substrate 11 from the region covered with the semiconductor package 12 in the present embodiment. According to such a configuration, the positional relationship between the pads 73 and a solder ball 62 of the semiconductor package 12 can be simplified. This makes it easy to carry out the test of the semiconductor device 1 and to carry out the arrangement and the like of the test pins 84 of the test device 81.

An insulating unit (the label 92 or the solder resist 91) covering the pads 73 is further included in the present embodiment. According to such a configuration, erroneous operation based on an erroneous signal input from the pads 73 during normal use can be prevented.

The substrate 11 is a single-side mounted substrate, and the second surface 11*b* is a non-component mount surface in the present embodiment. That is, the test pads 73 are arranged by employing the non-component mount surface of the single-side mounted substrate in the present embodiment. According to such a configuration, for example, there is no need to pose constraints for high density design to dispose pads in a narrow region of the first surface 11*a* of the substrate 11 or to adjust the positions for mounting other components mounted on the first surface 11*a*.

In addition, since the pads 73 can be arranged by employing a comparatively large area of the second surface 11*b*, a sufficient number of pads 73 can be arranged, and the test of the semiconductor device 1 can be performed meticulously. Furthermore, since the test pad electrodes can be arranged behind each component mounted on the first surface 11*a*, the length of the interconnect to be laid out can be decreased, and electrical loss can be avoided.

In addition, since the multiple pads 73 can be arranged at sufficient intervals by employing a comparatively large area, arrangement of the test pins 84 of the test device 81, connection of the test pins 84 to the pads 73, and the like can be simplified as well.

The number of third pads 73, for example, is greater than the number of first pads 71 in the present embodiment. According to such a configuration, the test of the semiconductor device 1 can be further meticulously performed. The arrangement of the multiple third pads 73 corresponds to the arrangement of the multiple second pads 72 in the present embodiment. According to such a configuration, the positional relationship between the pads 73 and the bonding wires 62 of the semiconductor package 12 can be further simplified, and the test of the semiconductor device 1 can be carried out more simply.

Here, it is assumed that a semiconductor device has a line connected to a test pad that extends from a signal line between the interface unit 15 of the substrate 11 and the controller 31 for comparative purposes. According to such a configuration, the impedance of the signal line changes because of the test line, and the quality of a signal may be affected when a high-speed differential signal flows therein.

Meanwhile, the controller 31 of the present embodiment includes the host interface unit 53 connected to the interface unit 15 of the substrate 11 and the memory interface unit 54 connected to the semiconductor memories 32. At least one of the multiple third pads 73 can be electrically connected to the memory interface unit 54 inside the controller 31 without passing through the host interface unit 53. According to such a configuration, the impedance of the signal line between the interface unit 15 of the substrate 11 and the controller 31 is not affected. Thus, the quality of a signal flowing in the signal line can be maintained at a high level.

The controller 31 includes the CPU 52 and the memory interface unit 54 that is electrically connected to the semiconductor memories 32 in the present embodiment. At least one of the multiple third pads 73 can be electrically connected to the memory interface unit 54 inside the controller 31 without passing through the CPU 52. According to such a configuration, the memory interface unit 54 can be directly accessed. Thus, the unit test of the semiconductor memories 32 can be facilitated, and the accuracy thereof can be improved.

The test pads arranged on the rear surface of the substrate has a comparatively small thickness in the present embodiment, and the thickness of the device does not change significantly in comparison with the semiconductor device according to the first embodiment. Therefore, even if the semiconductor device 1, for example, is disposed on the screen side of a detachable notebook PC as illustrated in FIG. 2 and FIG. 3, there is no need to change the thickness of a tablet.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device package, comprising:
   a substrate including, on an edge thereof, a connector that is connectable to a host;
   a nonvolatile semiconductor memory device disposed on a surface of the substrate;
   a memory controller disposed on the surface of the substrate;
   an oscillator disposed on the surface of the substrate and electrically connected to the memory controller and positioned farther from the connector than the memory controller is; and
   a seal member sealing the nonvolatile semiconductor memory device, the memory controller, and the oscillator on the surface of the substrate, wherein
   the memory controller is connected to the substrate by a plurality of wires on a plurality of sides of the memory controller other than a side that faces the nonvolatile semiconductor memory.

2. The semiconductor device package according to claim 1, wherein
   the oscillator is disposed in a region of the substrate defined by an edge of the nonvolatile semiconductor memory device, an edge of the memory controller, and edges of the seal member.

3. The semiconductor device package according to claim 1, further comprising:
   a volatile semiconductor memory device disposed on the surface of the substrate, wherein
   a region of the substrate covered by the seal member includes first and second regions that are diagonal to each other, and
   the oscillator is disposed in the first region, and the volatile semiconductor memory device is disposed in the second region.

4. The semiconductor device package according to claim 3, wherein
   a height of the volatile semiconductor memory device is greater than a height of the oscillator.

5. The semiconductor device package according to claim 1, further comprising:
   a temperature sensor disposed on the surface of the substrate, wherein
   a region of the substrate covered by the seal member includes first and second regions that are diagonal to each other, and
   the oscillator is disposed in the first region, and the temperature sensor is disposed in the second region.

6. The semiconductor device package according to claim 5, wherein
   a height of the temperature sensor is greater than a height of the oscillator.

7. The semiconductor device package according to claim 1, further comprising:
   a power supply circuit disposed on the surface of the substrate, wherein
   a region of the substrate covered by the seal member includes first and second regions that are diagonal to each other, and
   the oscillator is disposed in the first region, and the power supply circuit is disposed in the second region.

8. The semiconductor device package according to claim 1, wherein the oscillator includes a housing and a crystal element disposed within the housing.

9. The semiconductor device package according to claim 8, wherein
   the crystal element is electrically connected to the memory controller through a wiring formed in the housing.

10. A storage apparatus, comprising:
    a mother board having a plurality of connectors; and a plurality of semiconductor memory device packages, wherein each of the semiconductor memory device packages includes:
- a substrate including, on an edge thereof, a connector that is connected to one of the connectors of the mother board;
- a nonvolatile semiconductor memory device disposed on a surface of the substrate;
- a memory controller disposed on the surface of the substrate;
- an oscillator disposed on the surface of the substrate and electrically connected to the memory controller and positioned farther from the connector than the memory controller is; and
- a seal member sealing the nonvolatile semiconductor memory device, the memory controller, and the oscillator on the surface of the substrate, and
- the memory controller is connected to the substrate by a plurality of wires on a plurality of sides of the memory controller other than a side that faces the nonvolatile semiconductor memory.

11. The storage apparatus according to claim 10, wherein the oscillator is disposed in a region of the substrate defined by an edge of the nonvolatile semiconductor memory device, an edge of the memory controller, and edges of the seal member.

12. The storage apparatus according to claim 10, wherein
each of the semiconductor memory device packages further includes a volatile semiconductor memory device disposed on the surface of the substrate,
a region of the substrate covered by the seal member includes first and second regions that are diagonal to each other, and
the oscillator is disposed in the first region, and the volatile semiconductor memory device is disposed in the second region.

13. The storage apparatus according to claim 10, wherein
each of the semiconductor memory device packages further includes a temperature sensor disposed on the surface of the substrate,
a region of the substrate covered by the seal member includes first and second regions that are diagonal to each other, and
the oscillator is disposed in the first region, and the temperature sensor is disposed in the second region.

14. A computing apparatus, comprising:
a display;
a mother board having a first connector; and
a semiconductor memory device package including:
- a substrate including, on an edge thereof, a second connector that is connected to the first connector of the mother board;
- a nonvolatile semiconductor memory device disposed on a surface of the substrate;
- a memory controller disposed on the surface of the substrate;
- an oscillator disposed on the surface of the substrate, electrically connected to the memory controller, and positioned farther from the second connector than the memory controller is; and
- a seal member sealing the nonvolatile semiconductor memory device, the memory controller, and the oscillator on the surface of the substrate, wherein
- the memory controller is connected to the substrate by a plurality of wires on a plurality of sides of the memory controller other than a side that faces the nonvolatile semiconductor memory.

15. The computing apparatus according to claim 14, wherein
the oscillator is disposed in a region of the substrate defined by an edge of the nonvolatile semiconductor memory device, an edge of the memory controller, and edges of the seal member.

16. The computing apparatus according to claim 14, wherein
the semiconductor memory device package further includes a volatile semiconductor memory device disposed on the surface of the substrate,
a region of the substrate covered by the seal member includes first and second regions that are diagonal to each other, and
the oscillator is disposed in the first region, and the volatile semiconductor memory device is disposed in the second region.

17. The computing apparatus according to claim 14, wherein
the semiconductor memory device package further includes a temperature sensor disposed on the surface of the substrate,
a region of the substrate covered by the seal member includes first and second regions that are diagonal to each other, and
the oscillator is disposed in the first region, and the temperature sensor is disposed in the second region.

* * * * *